(12) United States Patent
Higashide (10) Patent No.: US 6,285,206 B1
(45) Date of Patent: Sep. 4, 2001

(54) COMPARATOR CIRCUIT

(75) Inventor: Kouichi Higashide, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/394,368

(22) Filed: Sep. 10, 1999

(30) Foreign Application Priority Data

Sep. 10, 1998 (JP) .................................................. 10-256295

(51) Int. Cl.[7] .................................................. G01R 31/26
(52) U.S. Cl. ........................ 324/765; 324/158.1; 327/341; 327/362
(58) Field of Search ............................... 324/73.1, 158.1, 324/761, 763, 765; 327/341, 317, 362; 702/85; 714/735, 736

(56) References Cited

U.S. PATENT DOCUMENTS

| | | | |
|---|---|---|---|
| 5,594,376 | * | 1/1997 | McBride et al. ..................... 327/236 |
| 5,661,427 | * | 8/1997 | McBride et al. ..................... 327/236 |
| 5,682,337 | * | 10/1997 | El-Fishawy et al. ................ 364/578 |

* cited by examiner

Primary Examiner—Ernest Karlsen
Assistant Examiner—Minh Tang
(74) Attorney, Agent, or Firm—David N. Lathrop; Gallagher & Lathrop (57) ABSTRACT

There is provided a comparator circuit which does not output any erroneous comparison result even if the resistance value of a resistance component that exists in the input circuit for a voltage comparator is large. In a comparator circuit in which an input voltage $V_O$ to be compared is supplied to one input terminal of a voltage comparator VCP through a voltage dividing circuit composed of a resistance component 13 that exists in the input circuit for the voltage comparator and a terminating resistor 14 and a comparison voltage $V_{REF}$ is supplied to the other input terminal of the voltage comparator from a comparison voltage source 16 to determine whether the input voltage is larger than or smaller than the comparison voltage, a voltage dividing resistance circuit for applying to the comparison voltage a voltage change equivalent to a voltage change of the input voltage produced in the voltage dividing circuit is provided between the comparison voltage source and the other input terminal of the voltage comparator, and a comparison voltage is supplied to the voltage comparator through the voltage dividing resistance circuit.

6 Claims, 6 Drawing Sheets

COMPARATOR CIRCUIT

BACKGROUND OF THE INVENTION

1. Field of the Invention

The present invention relates to a comparator circuit suitable for use in, for example, a semiconductor integrated circuit testing apparatus for testing and measuring various types of semiconductor integrated circuits.

2. Description of the Related Art

In a semiconductor integrated circuit testing apparatus (hereinafter referred to as IC testing apparatus) for testing and measuring a semiconductor integrated circuit (hereinafter referred to as IC), by way of example, if an IC to be tested (IC under test) is a digital type IC directed to a digital signal processing, whether or not the voltage of a response signal outputted from this IC under test has a prescribed voltage value of logical H (logical high level) or a prescribed voltage value of logical L (logical low level) is determined by a comparator circuit. Specifically, the comparator circuit determines whether the voltage of logical H outputted from the IC under test has a voltage value equal to or higher than the prescribed voltage value or not, or the comparator circuit determines whether the voltage of logical L outputted from the IC under test has a voltage value equal to or lower than the prescribed voltage value or not. When the determination result is "pass" (the response signal has a prescribed voltage value), the comparator circuit outputs a signal of logical H or logical L indicating "the pass result", and this logical signal is sent to a logical comparator circuit for inspecting whether the response of the IC under test is correct or not.

Figure 4:
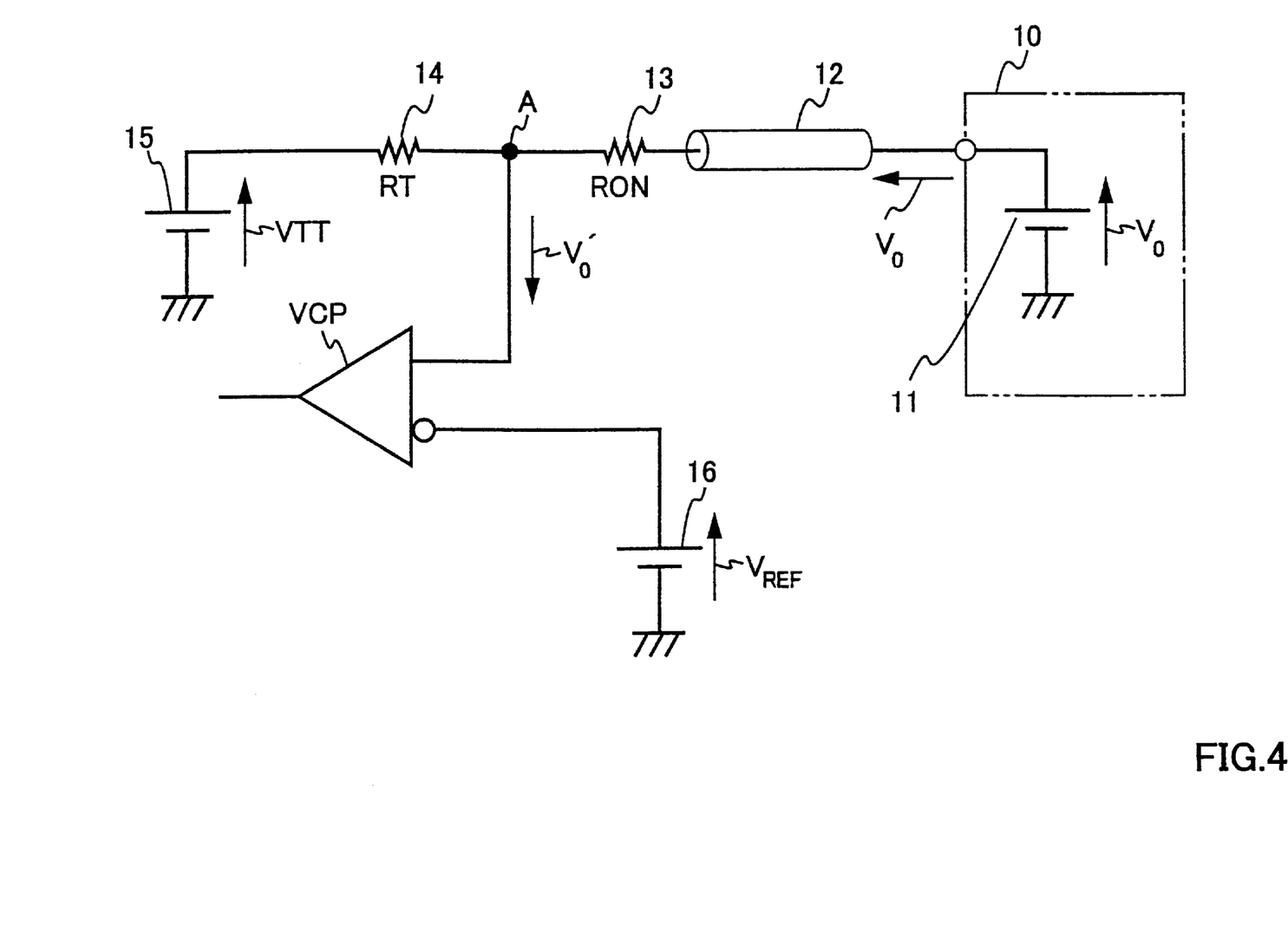
FIG. 4 is a schematic circuit diagram showing an example of the conventional comparator circuit.

FIG. 4 shows an example of the comparator circuit of this type used in a conventional IC testing apparatus. Although only one voltage comparator VCP used in the comparator circuit is shown in FIG. 4, in a practically used IC testing apparatus both the voltage of logical H and the voltage of logical L are compared and determined in the comparator circuit as to whether they have the prescribed voltages, respectively, and hence two voltage comparators are used in the comparator circuit. Here, since the comparisons of the two voltage values are not the requirements of the present invention, only one voltage comparator VCP for performing a voltage comparison for logical H is illustrated for clarity of the explanation, and the operation thereof will be described.

The voltage comparator VCP has, in this example, two input terminals one of which is a non-inverting input terminal and the other of which is an inverting input terminal, and an output terminal. The inverting input terminal is connected to a comparison (reference) voltage source 16 for outputting a prescribed comparison (reference) voltage $V_{REF}$.

In a readout mode in which a test pattern signal already written in an IC under test 10 is read out therefrom, as the IC under test is viewed from the outside, it can be considered to have a voltage output source 11 therein. Assuming that the voltage output source 11 outputs a voltage $V_O$, this voltage $V_O$ is supplied to one input terminal (in this example, the non-inverting input terminal) of the voltage comparator VCP via a signal line 12 from one terminal to which the voltage output source 11 is connected. Herein, the voltage $V_O$ outputted from the voltage output source 11 will be referred to as an input voltage to the voltage comparator VCP. The voltage comparator VCP functions, in this example, as a subtracter for subtracting the comparison voltage $V_{REF}$ from an input voltage applied to the non-inverting input terminal thereof and outputting a voltage of logical H or a voltage of logical L.

The signal line 12 for electrically connecting between the IC under test 10 and the one input terminal of the voltage comparator VCP has a resistance component. A total resistance component that exists in the input circuit for the voltage comparator VCP including this resistance component in the signal line 12 and a resistance component in a switch (not shown) for disconnecting the voltage comparator VCP from the IC under test 10 is denoted by a reference character 13, and its resistance value is represented by RON. In a write mode in which a test pattern signal is written in the IC under test 10, a driver (not shown) is connected to the IC under test 10, and the voltage comparator VCP is disconnected from the IC under test 10. The above switch is one for disconnecting the voltage comparator VCP from the IC under test 10 in the write mode, and a relay or a semiconductor switch element is usually used as such switch.

In order to take an impedance matching on the signal line 12, a terminating resistor (terminator) 14 is connected to the signal line 12, and further a terminator voltage source 15 for the terminating resistor 14 is provided. For example, in the case that the signal line 12 has its characteristic impedance of 50 Ω, the resistance value of the terminating resistor 14 is also set to 50 Ω, theby to terminate the terminal end of the signal line 12 with 50 Ω to maintain the signal line in the state that no reflection occurs.

Assuming that an output voltage of the terminator voltage source 15 is VTT, the resistance value of the terminating resistor 14 is RT and a connection point or junction between the terminating resistor 14 and the resistance component 13 that exists in the input circuit for the voltage comparator VCP is A, an electric potential at the connection point A is applied to the one input terminal of the voltage comparator VCP since the connection point A is connected to the one input terminal of the voltage comparator VCP. The electric potential of the connection point A is divided in voltage by a voltage dividing resistance circuit composed of the resistance value RON of the resistance component 13 and the resistance value RT of the terminating resistor 14. Accordingly, assuming that the divided voltage is $V_O'$, this divided voltage $V_O'$ is supplied to the one input terminal of the voltage comparator VCP.

The output voltage VTT of the terminator voltage source 15 is set to just the middle voltage between a voltage VH of logical H and a voltage VL of logical L outputted from the voltage output source 11 of the IC under test 10 (½ of the voltage of (VH+VL)). Due to such terminator voltage VTT, the electric potential at the connection point A is maintained at the voltage VTT when the output terminal of the IC under test 10 becomes high impedance mode. As a result, even if the IC under test 10 outputs a voltage of logical H or a voltage of logical L after that, a change in electric potential at the junction A is limited to half (½) of the voltage (VH−VL). Accordingly, the provision of the terminator voltage source 15 results in that the electric potential at the junction A can reach the target voltage value at high speed. For this reason, the terminator voltage source 15 is usually connected to the terminating resistor 14.

Figure 6:
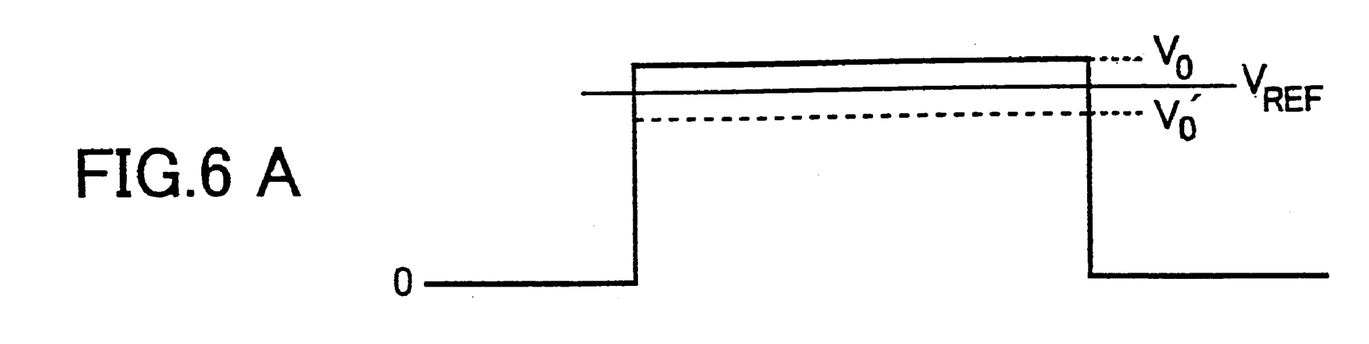
FIG. 6 is a waveform diagram for explaining an erroneous operation of the comparator circuit shown in FIG. 4.

When the voltage $V_O'$ at the connection point A is inputted to the one input terminal (in this example, non-inverting input terminal) of the voltage comparator VCP, and the comparison voltage $V_{REF}$ outputted from the comparison voltage source 16 is inputted to the other input terminal (in this example, inverting input terminal) of the voltage comparator VCP, the voltage $V_O'$ being a divided voltage of the input voltage $V_O$ outputted from the IC under test 10, the voltage comparator VCP outputs a voltage of logical H as shown in FIG. 6B if the voltage $V_O'$ of the connection point A is higher than the comparison voltage $V_{REF}$ ($V_O'>V_{REF}$), and outputs a voltage of logical L if the voltage $V_O'$ of the connection point A is lower than the comparison voltage $V_{REF}$ ($V_O'<V_{REF}$).

As mentioned above, in the comparator circuit in the IC testing apparatus, since the IC under test 10 is connected to the one input terminal of the voltage comparator VCP by the signal line 12, there is a drawback that the operation of voltage comparison is influenced by the resistance component 13 that exists in the input circuit for the voltage comparator VCP.

Specifically explaining, assumed that the voltage outputted from the voltage output source 11 of the IC under test 10 is $V_O$, the resistance value of the resistance component 13 is RON, the resistance value of the terminating resistor 14 is RT, and the output voltage of the terminator voltage source 15 is VTT as mentioned above, the voltage $V_O'$ of the connection point A is expressed by the following equation.

$$V_0' = \frac{1}{RT + RON} \cdot (RT \cdot V_0 + RON \cdot VTT)$$

In the above equation, if RON is zero (RON=0), $V_O'$ is equal to $V_O$ ($V_O'=V_O$), and hence no error is produced. However, if a semiconductor switch (for example, photo MOS relay) is used as a switch for disconnecting the voltage comparator VCP from the signal line 12, RON has a resistance value of approximately 1Ω or so. Accordingly, if RT is assumed to be 50 Ω, an error of approximately 2% (about 1/50) will occur in $V_O'$. If $V_O'$ should have been changed to a voltage lower than the comparison voltage $V_{REF}$ as shown in FIG. 6A due to the occurrence of such error, the voltage comparator VCP outputs a voltage of logical L as shown in FIG. 6C, notwithstanding that a voltage of logical H has been outputted from the IC under test 10. As a result, an erroneous comparison result is outputted from the voltage comparator VCP. Therefore, there is a problem that in the conventional comparator circuit even such a very small error as approximately 2% or so cannot be disregarded.

SUMMARY OF THE INVENTION

It is an object of the present invention to provide a comparator circuit which does not output any erroneous comparison result even if the resistance value of a resistance component that exists in the input circuit for a voltage comparator is large.

It is another object of the present invention to provide a comparator circuit which is used in a semiconductor device testing apparatus for testing a semiconductor device and is capable of correctly determining whether the voltage value of a response signal read out of a semiconductor device under test is larger than or smaller than a comparison voltage.

In order to accomplish the foregoing objects, in an aspect of the present invention, there is provided a comparator circuit comprising a voltage comparator having two input terminals one of which is supplied with an input voltage to be compared through a voltage dividing circuit, and the other of which is supplied with a comparison voltage from a comparison voltage source, the voltage dividing circuit being composed of a resistance component that exists in the input circuit for the voltage comparator and a terminating resistor, and determining whether the input voltage supplied to the one input terminal is larger than or smaller than the comparison voltage supplied to the other input terminal, and further comprising: compensating means provided between the comparison voltage source and the other input terminal of the voltage comparator, and for applying to the comparison voltage a voltage change equivalent to a voltage change of the input voltage produced in the voltage dividing circuit.

The aforesaid compensating means may be constructed by a voltage dividing resistance circuit having the same resistance ratio as the ratio of the resistance value of the aforesaid resistance component to the resistance value of the aforesaid terminating resistor, whereby the comparison voltage is divided in voltage by the voltage dividing resistance circuit to supply the divided comparison voltage to the other input terminal of the voltage comparator as a comparison voltage.

Alternatively, the aforesaid compensating means may be constituted by a digital correction operating circuit and a voltage generator having an analog-to-digital converter for converting a digital signal outputted from the digital correction operating circuit into an analog signal, the digital correction operating circuit obtaining, by operation, the same ratio of voltage division as that of the voltage dividing circuit to divide in voltage an input digital signal by operation. In such case, a digital signal corresponding to the voltage value of the comparison voltage generated from the comparison voltage source is inputted to the digital correction operating circuit where the input digital signal is divided in voltage by operation, and the voltage-divided digital signal is converted into an analog voltage by the voltage generator to supply the analog voltage to the other input terminal of the voltage comparator.

In another aspect of the present invention, there is provided a comparator circuit which is used in a semiconductor device testing apparatus wherein a predetermined test pattern signal is applied to a semiconductor device under test, the voltage value of an response signal read out of the semiconductor device under test is compared with a comparison voltage supplied from a comparison voltage source to determine whether the response signal is larger than or smaller than the comparison voltage, and the output of the determination result is supplied to a logical comparing circuit to inspect whether the response of the semiconductor device under test is correct or not. The comparator circuit comprises a voltage comparator having two input terminals one of which is supplied with a response signal of a semiconductor device under test through a voltage dividing circuit, and the other of which is supplied with the comparison voltage from the comparison voltage source, the voltage dividing circuit being composed of a resistance component that exists in the input circuit for the voltage comparator and a terminating resistor, and determines whether the voltage value of the response signal supplied to the one input terminal is larger than or smaller than the comparison voltage; and further comprises: compensating means provided between the comparison voltage source and the other input terminal of the voltage comparator, and for applying to the comparison voltage a voltage change equivalent to a voltage change of the response signal produced in the voltage dividing circuit.

In a preferred embodiment, the aforesaid compensating means is constructed by a voltage dividing resistance circuit having the same resistance ratio as the ratio of the resistance value of the resistance component to the resistance value of the terminating resistor, whereby the comparison voltage is divided in voltage by the voltage dividing resistance circuit to supply the divided comparison voltage to the other input terminal of the voltage comparator as a comparison voltage.

In an another preferred embodiment, the aforesaid compensating means is constituted by a digital correction operating circuit and a voltage generator having an analog-to-digital converter for converting a digital signal outputted from the digital correction operating circuit into an analog signal, the digital correction operating circuit obtaining, by operation, the same ratio of voltage division as that of the voltage dividing circuit to divide in voltage an input digital signal by operation. A digital signal corresponding to the voltage value of the comparison voltage generated from the comparison voltage source is inputted to the digital correction operating circuit where the input digital signal is divided in voltage by operation, and the voltage-divided digital signal is converted into an analog voltage by the voltage generator to supply the analog voltage to the other input terminal of the voltage comparator.

According to the aforesaid construction of the present invention, there is also provided in the comparison voltage source side an error producing mechanism equivalent to an error producing mechanism by which an input voltage inputted to the voltage comparator is influenced, and hence in the case that an error is produced by the error producing mechanism in the input voltage side, the comparison voltage is also influenced by the same error producing mechanism in the comparison voltage source side, so that both the input voltage and the comparison voltage are corrected in their voltage values substantially to the same degree. Consequently, it is possible that the voltage comparator always performs a correct voltage comparison regardless of the magnitude of the resistance value of the resistance component that exists in the supply side of the input voltage.

DETAILED DESCRIPTION OF THE PREFERRED EMBODIMENTS

Figure 5:
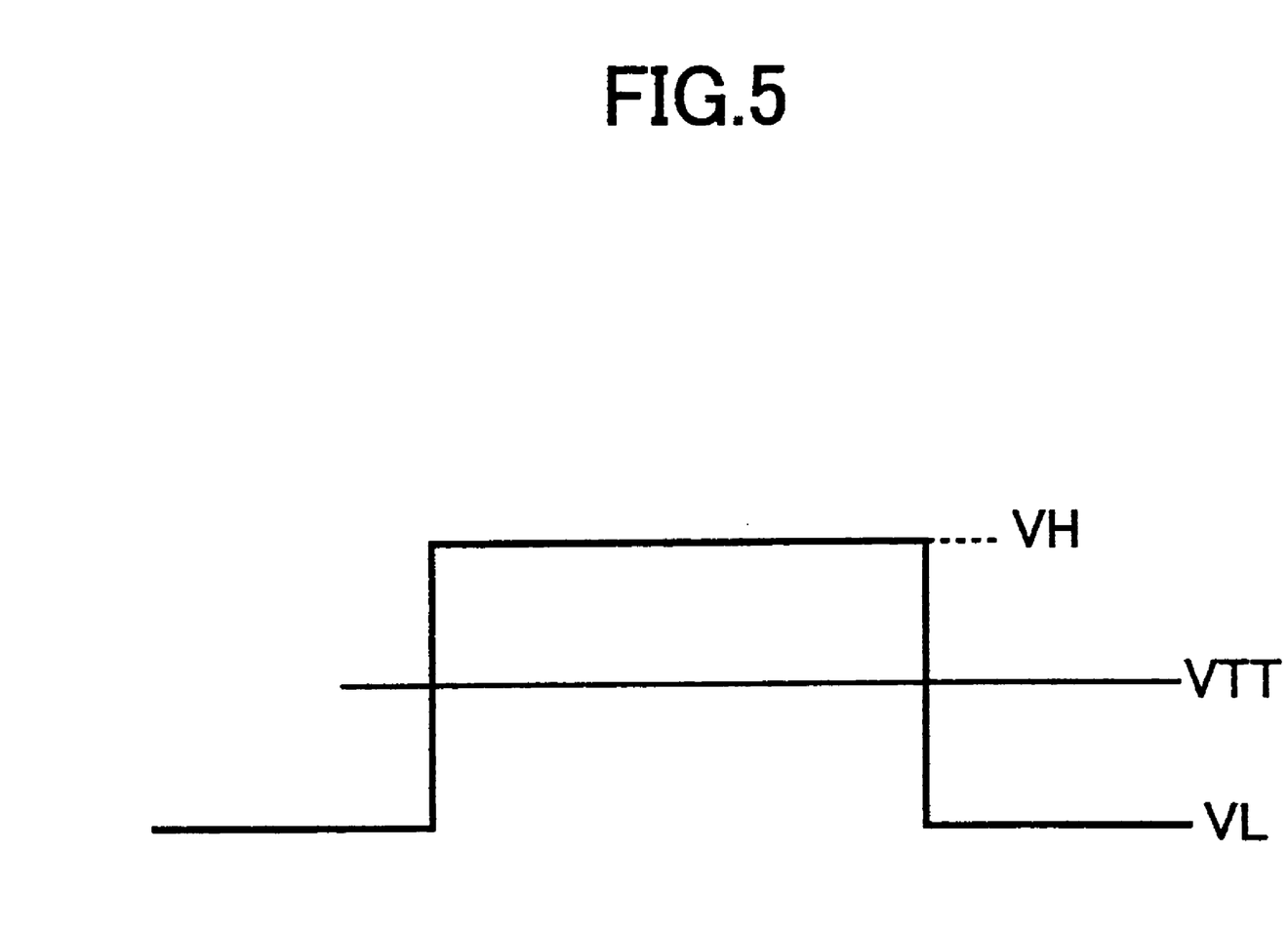
FIG. 5 is a waveform diagram for explaining the operation of the conventional comparator circuit shown in FIG. 4.

Now, preferred embodiments of the present invention will be described in detail with reference to FIGS. 1 to 3. Further, portions and/or elements in FIGS. 1 to 3 corresponding to those in FIGS. 4 to 6 will be shown by the same reference characters affixed thereto, and the explanation thereof will be omitted unless it is necessary.

Figure 1:
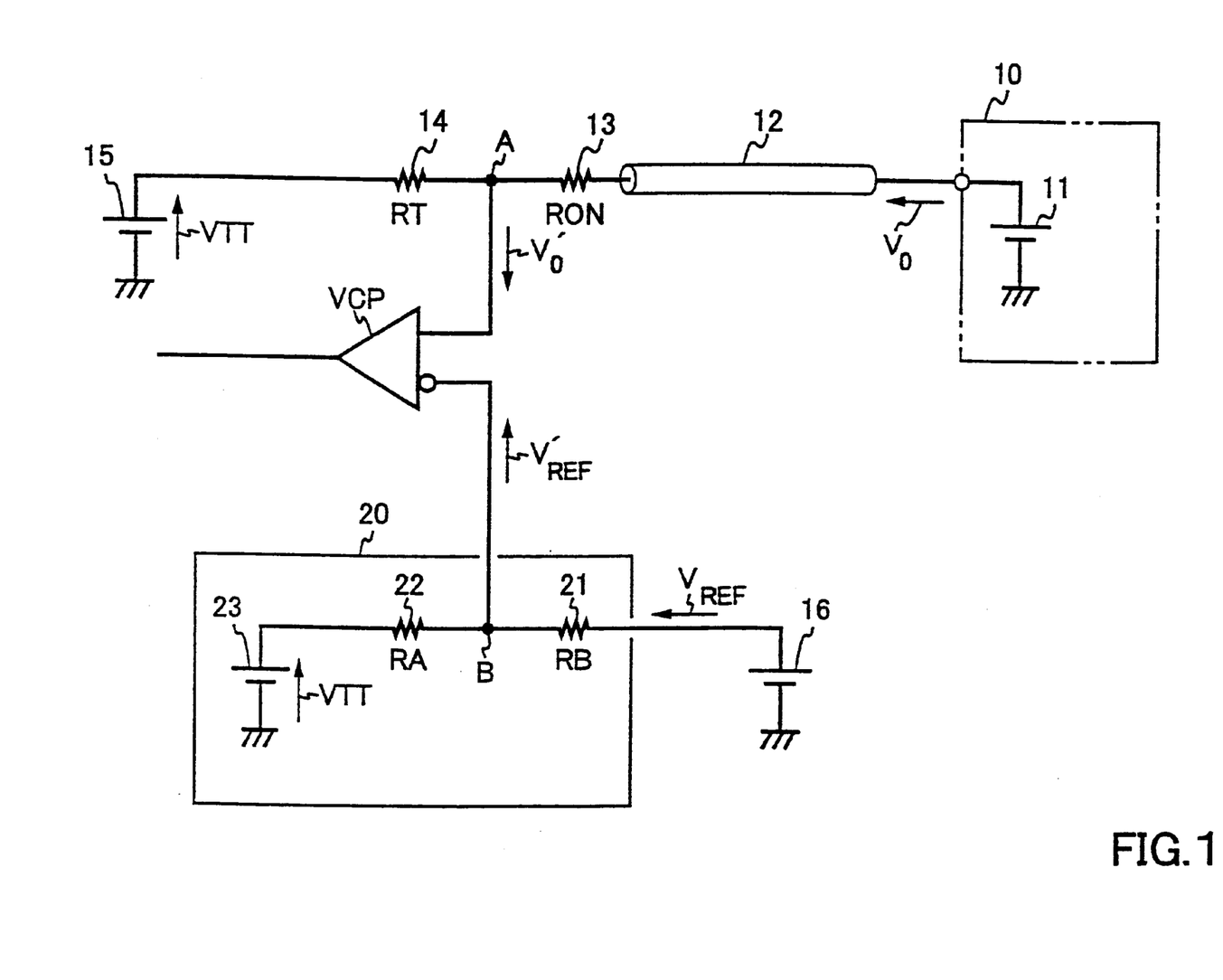
FIG. 1 is a schematic circuit diagram showing a first embodiment of the comparator circuit according to the present invention.
Figure 2:
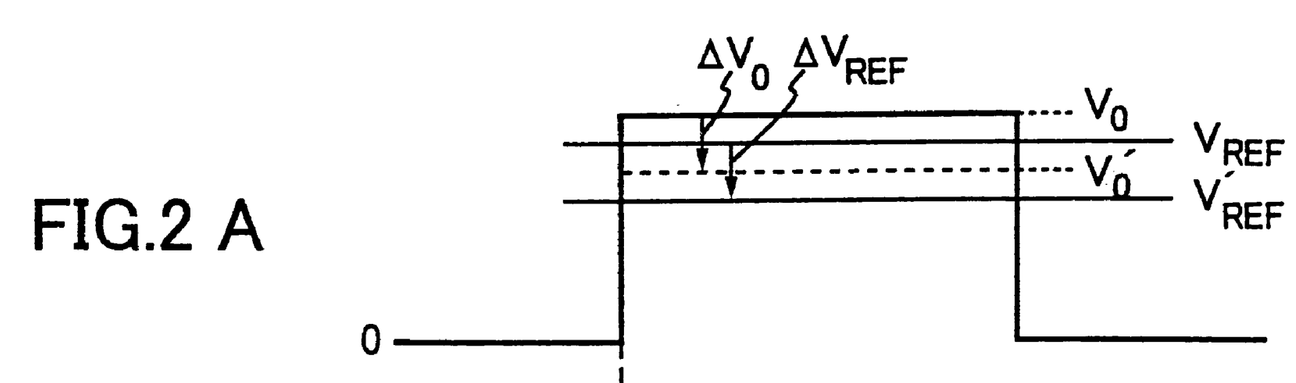
FIG. 2 is a waveform diagram for explaining the operation of the comparator circuit according to the present invention shown in FIG. 1.

FIG. 1 is a schematic circuit diagram showing a first embodiment in which the comparator circuit according to the present invention is applied to an IC testing apparatus. Like FIG. 4, in FIG. 1 only one voltage comparator for performing a voltage comparison for logical H is shown as a voltage comparator VCP to be used in the comparator circuit. However, it is needless to say that the other voltage comparator for performing the voltage comparison for logical L is also used in the IC testing apparatus practically utilized.

In the illustrated voltage comparator VCP, one input terminal (in this example, non-inverting input terminal) to which an input voltage $V_O$ is supplied is connected to the connection point or junction A between the resistance component 13 and the terminating resistor 14, and the other input terminal (in this example, inverting input terminal) is connected to the comparison voltage source 16 via a compensating circuit 20 to be described later. Further, the output terminal of the voltage comparator VCP is connected to a logical comparing circuit (not shown) for inspecting whether a response from the IC under test is correct or not.

In the present invention, as shown in FIG. 1, the comparator circuit is constructed such that the comparison voltage $V_{REF}$ outputted from the comparison voltage source 16 is inputted to the compensating circuit 20 that is constructed by a voltage dividing resistance circuit, and in this compensating circuit 20 the comparison voltage $V_{REF}$ is applied with a voltage change equivalent to the voltage change that the input voltage $V_O$ supplied to the one input terminal (non-inverting terminal) of the voltage comparator VCP is applied, thereby to supply the compensated comparison voltage to the other input terminal (inverting terminal) of the voltage comparator VCP.

The compensating circuit 20 is a voltage dividing resistance circuit composed of a first resistor 21 one end of which is connected to the comparison voltage source 16 and a second resistor 22 connected between the other end of the first resistor 21 and a voltage source 23, and the other input terminal (inverting terminal) of the voltage comparator VCP is connected to a connection point B or junction between the first resistor 21 and the second resister 22. Further, the voltage of the voltage source 23 is set to a voltage equal to the voltage VTT of the terminator voltage source 15.

Assuming that the resistance value of the first resistor 21 is RB, and the resistance value of the second resistor 22 is RA, the resistance ratio RA/RB of these resistors is set to the resistance ratio RT/RON of the resistance value of the terminating resistor 14 and the resistance value RON of the resistance component 13. That is, the resistance values RA and RB are selected such that the equation RA/RB=RT/RON is satisfied. Since the voltage of the voltage source 23 is set to a voltage equal to the voltage VTT of the terminator voltage source 15, by setting the resistance values of the four resistors as such, the voltage $V'_{REF}$ at the connection point B is expressed by the following equation:

$$V'_{REF} = \frac{1}{RA + RB} \cdot (RA \cdot V_{REF} + RB \cdot VTT)$$

When the resistance value RON of the resistance component 13 is zero, the resistance value RB of the first resistor 21 is also set to zero. Therefore, the comparison voltage $V_{REF}$ is directly supplied to the other input terminal of the voltage comparator VCP from the connection point B. On the contrary, if the resistance value RON of the resistance component 13 is changed from zero to 1 Ω, the comparison voltage $V_{REF}$ is voltage-divided by the compensating circuit 20 to become the corrected comparison voltage $V'_{REF}$ since the ratio RA/RB of the resistance values of the first resistor 21 and the second resistor 22 of the compensating circuit 20 is set to be equal to the ratio RT/RON. Thus, the corrected comparison voltage $V'_{REF}$ supplied to the other input terminal of the voltage comparator VCP from the connection point B.

Since the equation RA/RB=RT/RON is satisfied, the amount of voltage change $\Delta V'_{REF}$ from the comparison voltage $V_{REF}$ to the corrected comparison voltage $V'_{REF}$ that is the voltage-divided voltage by the compensating circuit 20 has, as shown in FIG. 2A, the same magnitude and direction as those of the amount of voltage change $\Delta V_O$ when the input voltage $V_O$ is voltage-divided and is changed to the voltage-divided voltage $V_O'$.

Therefore, since the input voltage $V_O$ and the comparison voltage $V_{REF}$ are changed by the amount of the same voltage change, the voltage difference between the input voltage $V_O$ and the comparison voltage $V_{REF}$ is also maintained to the same value in the case of the voltage difference between the voltage-divided voltage $V_O'$ supplied to the one input terminal of the voltage comparator VCP and the corrected comparison voltage $V'_{REF}$ supplied to the other input terminal of the voltage comparator VCP. That is, the voltage comparator VCP can compare, without being influenced by the resistance value RON of the resistance component 13 or the voltage value VTT of the terminator voltage source 15, the input voltage $V_O$ with the comparison voltage $V_{REF}$.

In this manner, when the input voltage $V_O$ is higher than the comparison voltage $V_{REF}$ ($V_O > V_{REF}$), the voltage comparator VCP outputs, as shown in FIG. 2B, a voltage of logical H. In addition, even if the resistance value RON of the resistance component 13 or the voltage value VTT of the terminator voltage source 15 is changed, the voltage-divided voltage $V_O'$ supplied to the one input terminal is higher than the corrected comparison voltage $V'_{REF}$ supplied to the other input terminal at that time. As a result, the voltage comparator VCP also outputs, as shown in FIG. 2C, a voltage of logical H. Therefore, a correct comparison result can always be outputted, and the reliability of the comparator circuit can be increased.

Further, the ratio RA/RB of the resistance values of the first and the second resistors 21 and 22 may be set to be equal to the ratio RT/RON of the resistance value RT of the terminating resistor 14 and the resistance value RON of the resistance component 13 by previously measuring the resistance value RT of the terminating resistor 14 and the resistance value RON of the resistance component 13 and determining the resistance values of the first and the second resistors 21 and 22 on the basis of the measured results.

Figure 3:
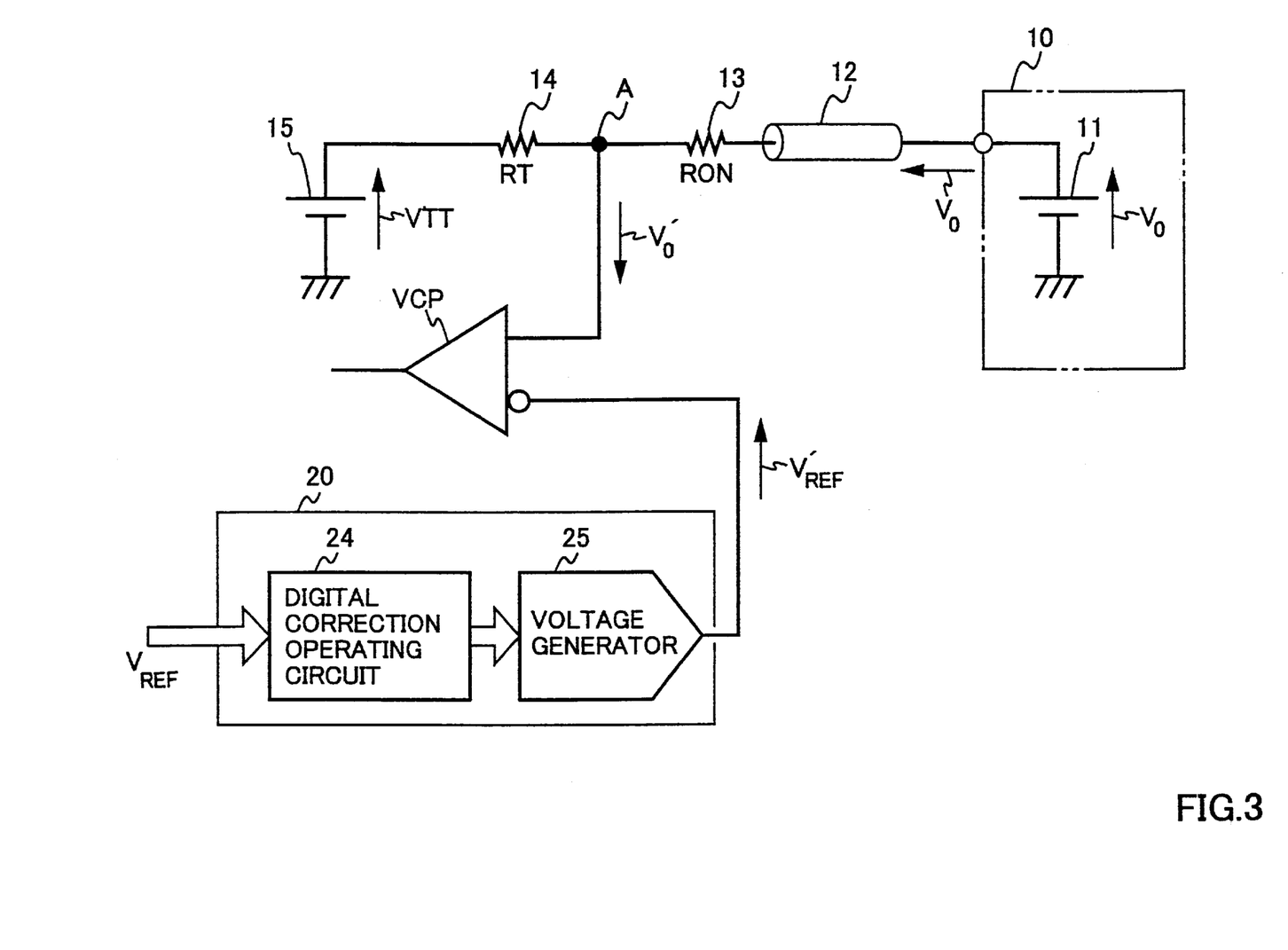
FIG. 3 is a schematic circuit diagram showing a second embodiment of the comparator circuit according to the present invention.

FIG. 3 is a schematic circuit diagram showing a second embodiment of the comparator circuit according to the present invention in which the compensating circuit 20 is constructed by a digital circuit. In this second embodiment, the compensating circuit 20 comprises, for example, a digital correction operating circuit 24 constituted by, for example, a operation processing or arithmetic and logic unit such as a microcomputer and a voltage generator 25 constituted by a digital-analog (D/A) converter.

Next, the operation of the compensating circuit 20 constructed as mentioned above will be described. First of all, a digital value corresponding to the comparison voltage $V_{REF}$ is supplied to the digital correction operating circuit 24, and operation or computation of the comparison voltage $V_{REF}$ of the digital value is performed by the following equation to obtain a compensated comparison voltage $V'_{REF}$:

$$V'_{REF} = \frac{1}{RT + RON} \cdot (RT \cdot V_{REF} + RON \cdot VTT)$$

That is, by the operation or computation based on the above equation the ratio of voltage division of the voltage dividing circuit composed of the resistance component 13 that exists in the input circuit for the voltage comparator VCP and the terminating resistor 14, and this obtained ratio of voltage division is multiplied by the comparison voltage $V_{REF}$, thereby to find the compensated comparison voltage $V'_{REF}$ by the operation or computation based on the equation.

Then, a digital signal having a value corresponding to this compensated comparison voltage $V'_{REF}$ is supplied to the voltage generator 25 from the digital correction operating circuit 24. The voltage generator 25 converts the inputted digital signal into an analog compensated comparison voltage $V'_{REF}$, and supplies the compensated comparison voltage $V'_{REF}$ to the other input terminal of the voltage comparator VCP.

As a result, the voltage comparator VCP compares. when the resistance value RON of the resistance component 13 or the voltage value VTT of the terminator voltage source 15 is changed, the analog compensated comparison voltage $V'_{REF}$ supplied to the other input terminal with the voltage-divided voltage $V_O'$ supplied to the one input terminal. Therefore, similarly to the first embodiment, the voltage comparator VCP can always output a correct comparison result without being influenced at all by any change of the resistance value RON of the resistance component 13 or any change of the voltage VTT of the terminator voltage source 15.

Further, in each of the above embodiments, a case in which the present invention is applied to a comparator circuit for an IC testing apparatus. However, it could easily be understood that the present invention can be applied not only to the comparator circuit used in the IC testing apparatus but also equally be applied to comparator circuits each for comparing an input voltage with a comparison (reference) voltage in various technical fields.

As apparent from the above explanation, according to the present invention, the comparator circuit is constructed such that a voltage change equivalent to a voltage change that is given, by the presence of the resistance component of the input circuit, to an input voltage inputted to the voltage comparator is similarly given to a comparison (reference) voltage inputted to the voltage comparator. Therefore, even if the resistance component of the input circuit is changed, the comparator circuit does not output an erroneous comparison result. Therefore, there can be obtained from the present invention an advantage that the reliability of the comparator circuit is further increased.

While the present invention has been described with regard to the preferred embodiments shown by way of example, it will be apparent to those skilled in the art that various modifications, alterations, changes, and/or minor improvements of the illustrated embodiments can be made without departing from the spirit and the scope of the present invention. Accordingly, it should be understood that the present invention is not limited to the embodiments shown and described above, and is intended to encompass such various modifications, alterations, changes, and/or minor improvements falling within the invention defined by the appended claims.

What is claimed is:

1. A comparator circuit comprising
    a voltage comparator having two input terminals one of which is supplied with an input voltage to be compared through a voltage dividing circuit, and the other of which is supplied with a comparison voltage from a comparison voltage source, said voltage dividing circuit comprising a resistance component that exists in the input circuit for the voltage comparator and a terminating resistor, and determining whether the input voltage supplied to the one input terminal is larger than or smaller than the comparison voltage supplied to the other input terminal, said comparator circuit further comprising:

compensating means, provided between said comparison voltage source and the other input terminal of said voltage comparator, for changing the comparison voltage by an amount equivalent to a voltage change of the input voltage produced in said voltage dividing circuit.

2. The comparator circuit according to claim 1, wherein said compensating means comprises a voltage dividing resistance circuit having the same resistance ratio as the ratio of the resistance value of said resistance component to the resistance value of said terminating resistor, whereby the comparison voltage is divided in voltage by said voltage dividing resistance circuit to supply the divided comparison voltage to the other input terminal of the voltage comparator as a comparison voltage.

3. The comparator circuit according to claim 1, wherein said compensating means comprises a digital correction operating circuit and a voltage generator having a digital-to-analog converter for converting a digital signal outputted from said digital correction operating circuit into an analog signal, said digital correction operating circuit obtaining, by operation, the same ratio of voltage division as that of said voltage dividing circuit to divide an input digital signal by operation, wherein said input digital signal corresponds to the voltage value of the comparison voltage generated from said comparison voltage source, and said analog signal is supplied to the other input terminal of the voltage comparator.

4. A comparator circuit used in a semiconductor device testing apparatus in which a predetermined test pattern signal is applied to a semiconductor device under test, the voltage value of an response signal read out of the semiconductor device under test is compared with a comparison voltage supplied from a comparison voltage source to determine whether the response signal is larger than or smaller than the comparison voltage, and the output of the determination result is supplied to a logical comparing circuit to inspect whether the response of the semiconductor device under test is correct or not, said comparator circuit comprising a voltage comparator having two input terminals one of which is supplied with a response signal of a semiconductor device under test through a voltage dividing circuit, and the other of which is supplied with the comparison voltage from said comparison voltage source, said voltage dividing circuit being comprising a resistance component that exists in the input circuit for the voltage comparator and a terminating resistor, and determining whether the voltage value of the response signal supplied to the one input terminal is larger than or smaller than the comparison voltage, and further comprising:

compensating means provided between said comparison voltage source and the other input terminal of said voltage comparator, for changing the comparison voltage by an amount equivalent to a voltage change of the response signal produced in said voltage dividing circuit.

5. The comparator circuit according to claim 4, wherein said compensating means comprises a voltage dividing resistance circuit having the same resistance ratio as the ratio of the resistance value of said resistance component to the resistance value of said terminating resistor, whereby the comparison voltage is divided in voltage by said voltage dividing resistance circuit to supply the divided comparison voltage to the other input terminal of the voltage comparator as a comparison voltage.

6. The comparator circuit according to claim 4, wherein said compensating means comprises a digital correction operating circuit and a voltage generator having a digital-to-analog converter for converting a digital signal outputted from said digital correction operating circuit into an analog signal, said digital correction operating circuit obtaining, by operation, the same ratio of voltage division as that of said voltage dividing circuit to divide an input digital signal by operation, wherein said input digital signal corresponds to the voltage value of the comparison voltage generated from said comparison voltage source, and said analog signal is supplied to the other input terminal of the voltage comparator.

* * * * *